United States Patent
Dai

(10) Patent No.: US 8,717,067 B2
(45) Date of Patent: May 6, 2014

(54) METHOD AND APPARATUS FOR CONTINUOUS-AVERAGING COUNTER-BASED DIGITAL FREQUENCY LOCK DETECTOR

(75) Inventor: Xingdong Dai, Bethlehem, PA (US)

(73) Assignee: Agere Systems LLC, Allentown, PA (US)

( * ) Notice: Subject to any disclaimer, the term of this patent is extended or adjusted under 35 U.S.C. 154(b) by 1077 days.

(21) Appl. No.: 11/068,225

(22) Filed: Feb. 28, 2005

(65) Prior Publication Data

US 2006/0192593 A1  Aug. 31, 2006

(51) Int. Cl.
*H03D 13/00* (2006.01)
(52) U.S. Cl.
USPC .......................................................... 327/43
(58) Field of Classification Search
USPC .................. 327/43, 44, 45, 46, 47, 48, 49
See application file for complete search history.

(56) References Cited

U.S. PATENT DOCUMENTS

| 4,691,330 | A | * | 9/1987 | Takahashi et al. | 377/39 |
| 4,715,050 | A | * | 12/1987 | Tanaka et al. | 375/362 |
| 6,320,469 | B1 | * | 11/2001 | Friedberg et al. | 331/1 A |
| 7,242,229 | B1 | * | 7/2007 | Starr et al. | 327/156 |
| 2005/0140418 | A1 | * | 6/2005 | Muniandy et al. | 327/291 |

OTHER PUBLICATIONS

U.S. Appl. No. 11/053,365, filed Feb. 8, 2005, Dai et al.

* cited by examiner

*Primary Examiner* — Lincoln Donovan
*Assistant Examiner* — Khareem E Almo
(74) *Attorney, Agent, or Firm* — Ryan, Mason & Lewis, LLP

(57) ABSTRACT

Methods and apparatus are provided for counter-based digital frequency lock detection. A counter-based digital frequency lock detector in accordance with the present invention comprises a reference counter clocked by a reference clock and a target counter clocked by a target clock. The target counter is n bits and n is less than a number of bits of the reference counter. A frequency offset violation of the target clock is detected by comparing a value of the target counter to an n bit counter.

17 Claims, 2 Drawing Sheets

| APPLICATION STANDARDS | CLOCK TOLERANCE (ppm) | MINIMUM OUTPUT INTERVAL (REFERENCE CYCLES) | MINIMUM COUNTER LENGTH (BITS) |
|---|---|---|---|
| SONET, SERIAL A SCSI, IEEE 1394, FIBRE CHANNEL, 10GbE XAUI | 100 | 10000 | 14 |
| PCI EXPRESS | 300 | 10000 | 14 |
| SERIAL ATA WITHOUT SPREAD SPECTRUM | 350 (400) | 2500 | 12 |
| SERIAL ATA WITH SPREAD SPECTRUM | 5000 | 200 | 8 |

METHOD AND APPARATUS FOR CONTINUOUS-AVERAGING COUNTER-BASED DIGITAL FREQUENCY LOCK DETECTOR

FIELD OF THE INVENTION

The present invention relates generally to frequency lock detection circuits, and more particularly, to digital frequency lock detectors.

BACKGROUND OF THE INVENTION

Clock recovery circuits and their associated frequency lock detection circuits are widely used, for example, in modern communications systems. Frequency lock detectors are used, for example, to obtain clock tolerance and offset information. Counter-based digital frequency lock detectors obtain clock offset information at fixed or programmable time intervals. Clock offset information is used in many applications, such as tuning clock generators. Typically, a counter-based digital frequency lock detector contains two equal-length counters. A first counter, generally referred to as the target counter, is clocked by the target clock. A second counter, generally referred to as the reference counter, is clocked by a reference clock.

The counter-based digital frequency lock detector ensures that the target clock stays within a desired tolerance of the reference clock. For example, a system, such as a SONET optical ring network, may require a clock offset tolerance of 100 parts-per-million (ppm). In such an implementation, both counters are initialized with the same initial count before starting to count. For example, if "up" counters are used, the initial count is set to zero. When the reference counter reaches a predefined count, such as 10,000, the value of the target counter is evaluated. If the target counter has a value between 9999 (−100 ppm) and 10001 (+100 ppm), the target clock has satisfied the 100 ppm offset requirement.

Thus, the output of the counter-based digital frequency lock detector is updated when the reference counter reaches the predefined count, and the target counter is examined to determine if the target counter value falls within a certain tolerance range. The tolerance range or offset range is an integer obtained by subtracting the maximum negative PPM count from the minimum positive PPM count. The predefined count is typically a very large number and the frequency offset cannot be determined until the reference counter reaches this large number. Thus, the frequency offset status output can only change at a fixed time interval, which may not be desirable in applications where prompt detection is required. A need therefore exists for a counter-based digital frequency lock detector that can evaluate a frequency offset more quickly than such conventional designs.

SUMMARY OF THE INVENTION

Generally, methods and apparatus are provided for counter-based digital frequency lock detection. A counter-based digital frequency lock detector in accordance with the present invention comprises a reference counter clocked by a reference clock and a target counter clocked by a target clock. According to one aspect of the invention, the target counter is n bits and n is less than a number of bits of the reference counter. A frequency offset violation of the target clock is detected by comparing a value of the target counter to an n bit counter.

In one embodiment, a frequency offset violation occurs when the target clock has a frequency offset relative to the reference clock that violates a predefined threshold. For example, the frequency offset violation can be detected by comparing the target counter to a second n bit reference counter clocked by the reference clock. In a further variation, the frequency offset violation is detected by comparing the target counter to n least significant bits of the reference counter.

A more complete understanding of the present invention, as well as further features and advantages of the present invention, will be obtained by reference to the following detailed description and drawings.

DETAILED DESCRIPTION

The present invention provides a counter-based digital frequency lock detector that can evaluate a frequency offset more quickly than such conventional designs. The present invention recognizes that although a number of standards, such as SONET and PCI Express require the reference and target counters to have a length between 8 and 14 bits, the tolerance range on the frequency offset is typically only 2 to 3 bits.

Figures 1, 2:
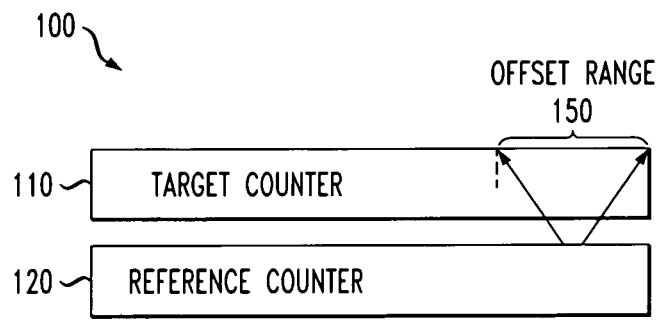
FIG. 1 illustrates a conventional counter-based digital frequency lock detector.
FIG. 2 is a sample table illustrating clock tolerance, output interval and counter length requirements for a number of well known communication standards.

FIG. 1 illustrates a conventional counter-based digital frequency lock detector 100. The exemplary counter-based digital frequency lock detector 100 comprises two equal-length counters 110, 120. The target counter 110 is clocked by the target clock and the reference counter 120 is clocked by a reference clock. As previously indicated, the counter-based digital frequency lock detector 100 ensures that the target clock stays within a desired tolerance of the reference clock. The counters 110, 120 are initialized with the same initial count before starting to count. When the reference counter 120 reaches a predefined count, such as 10,000, the value of the target counter 110 is evaluated. Upon evaluation, the value of the target counter 110 must be within a specified offset range 150.

FIG. 2 is a sample table illustrating clock tolerance, output interval and counter length requirements for a number of well known communication standards. As shown in FIG. 2, the standards typically require the length of the counters 110, 120 to be 8 to 14 bits.

According to one aspect of the invention, continuous averaging techniques are applied to counter-based digital frequency lock detectors. The disclosed technique is both area-efficient and robust. For example, an exemplary implementation has demonstrated 25% to 38% reductions in area in Taiwan Semiconductor Manufacturing Corporation (TSMC) 0.13 um technology, relative to conventional designs. In addition, the continuous averaging counter-based digital frequency lock detectors of the present invention can detect certain transient out-of-range offset errors with no added overheads. Further, the disclosed detectors can restart as soon as a definite output is obtained, rather than outputting a value only at a fixed time interval. Thus, the disclosed detectors provide quicker system response for certain applications.

Figure 3:
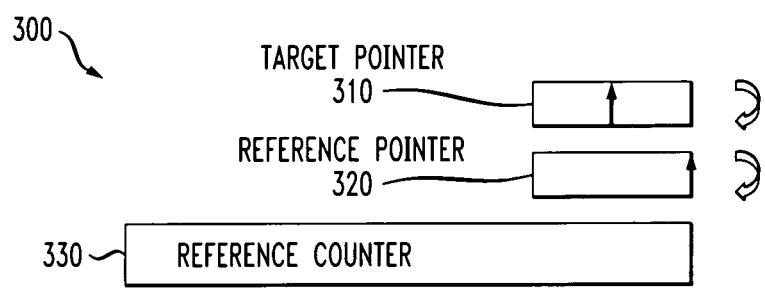
FIG. 3 illustrates a continuous averaging counter-based digital frequency lock detector incorporating features of the present invention.

While the standards outlined in FIG. 2 typically require the length of the counters 110, 120 to be 8 to 14 bits, the present invention recognizes that the tolerance range can generally be encoded with only 2 to 3 bits. FIG. 3 illustrates a continuous averaging counter-based digital frequency lock detector 300 incorporating features of the present invention. The continuous averaging counter-based digital frequency lock detector 300 comprises a longer reference counter 330 clocked by reference clock, and two smaller counters 310, 320. Thus, the continuous averaging counter-based digital frequency lock detector 300 using only a single long counter 330, compared to the two long counters 110, 120 of the conventional design of FIG. 1.

One small counter 310, referred to as the target pointer, is clocked by the target clock and the second small counter 320, referred to as the reference counter, is clocked by the reference clock. The two small counters 310, 320 are offset to fit the tolerance range at initialization. If frequency lock has a balanced PPM requirement, i.e., +PPM and −PPM are identical, then the two pointers will be placed exactly a half tolerance range apart. If frequency lock has an unbalanced PPM requirement, as in the case of many spread spectrum applications, where +PPM is not equal to −PPM, the distance between the two pointers will be separated based on the ratio between +PPM and −PPM.

The counters 310, 320 can be considered first-in-first-out (FIFO) pointers. The range of the FIFO is equal to the offset range. Both counters 310, 320 have the same count direction, i.e., both counters count up or both counters count down. When the pointer reaches the end, the counter will loop around and continue the same count direction again, unless the counter is stopped by a reset. For example, consider a 3-bit counter counting from 0 upwards to 7. Once the counter reaches 7, the next count will be 0, next 1, 2, and so on. A "FIFO" overflow occurs when the two counters have the same count, because the pointers have been initialized to different counts. Should there be no frequency difference, the two counters will never have the same count. If the target pointer catches the reference pointer, the target clock is too fast (a +PPM violation). If the reference pointer catches the target pointer, the target clock is too slow (a −PPM violation). A "FIFO" overflow will set the status bit to indicate that the target clock has violated the frequency lock requirement.

If, however, the target clock has a large transit offset, then the "FIFO" counter will overflow before the long counter 330 reaches the predefined value. It is noted that the overflow cannot be masked by an opposite offset later in time to achieve average offset within tolerance. In the prior art, this type of frequency lock violation can go without being detected. This is also a significant part of the motivation for the current design.

If the FIFO counter overflows, a threshold violation on the frequency offset can be immediately detected. Thus, when the small counters 310, 320 reach an overflow condition before the long counter 330 counts out, the detector 300 can restart, rather than waiting for the full count to be reached. This allows for a quick system response in certain applications.

The disclosed continuous averaging technique enables more reliable detection, and early detection and shorter output latency, should the target clock 310 run outside the desired tolerance range. In the conventional approach shown in FIG. 1, this type of transient offset error can be hidden, since counter can only detect offset at the end of count. The disclosed continuous averaging architecture detects clock offsets in decreasing order until the targeted tolerance is reached at the end of the long count.

In addition, the use of the two small counters 310, 320 uses fewer bits than the long counter 330, resulting in area, power, and cost savings, relative to the conventional design 100.

Figure 4:
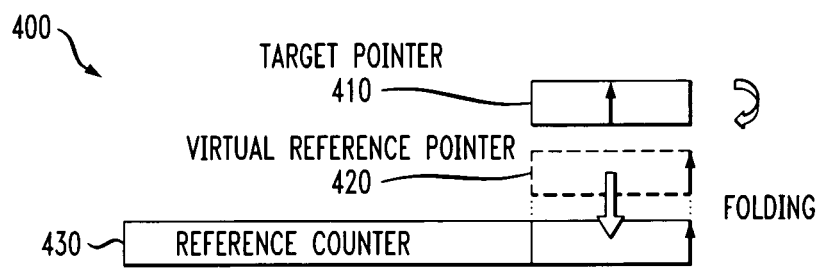
FIG. 4 illustrates an alternate continuous averaging counter-based digital frequency lock detector incorporating features of the present invention.

FIG. 4 illustrates an alternate continuous averaging counter-based digital frequency lock detector 400 incorporating features of the present invention. The continuous averaging counter-based digital frequency lock detector 400 modifies the implementation of FIG. 3 by "folding" the small counter 420 of the reference clock into least significant bits (LSB) of the long counter 430, which is also clocked by the reference clock. Therefore, the disclosed continuous averaging architecture can be realized with one long counter 430 and one small counter 410 (providing a virtual triple counter but using only two counters). The length of the small counter 410 is typically fixed, representing the tolerance range. The length of the long counter 430 is set by the clock tolerance requirement. The value of the small counter 410 is evaluated when the LSBs of the long counter 430 reach the predefined value. The embodiment of FIG. 4 provides further area, power and cost improvements.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

I claim:

1. A counter-based digital frequency lock detector, comprising:
    a reference counter clocked by a reference clock; and
    a target counter clocked by a target clock, wherein said target counter is n bits, and n is less than a number of bits of said reference counter, and wherein a frequency offset violation of said target clock is detected by comparing a count value of said target counter to a count value of an n bit counter, wherein said frequency offset violation occurs when said target clock has a frequency offset relative to said reference clock that is greater than or equal to a non-zero predefined threshold value, wherein said count value of said target counter indicates a number of clock cycles of said target clock since a reset of said target counter and wherein said count value of said n bit counter indicates a number of clock cycles of said reference clock since a reset of said n bit counter.

2. The counter-based digital frequency lock detector of claim 1, wherein said frequency offset violation is detected by comparing said target counter to a second n bit reference counter clocked by said reference clock.

3. The counter-based digital frequency lock detector of claim 1, wherein said frequency offset violation is detected by comparing said target counter to n least significant bits of said reference counter.

4. The counter-based digital frequency lock detector of claim 1, wherein said frequency offset violation can be detected before said reference counter reaches a maximum value.

5. The counter-based digital frequency lock detector of claim 1, wherein said frequency offset violation includes one or more transient out-of-range offset errors.

6. A method for detecting a frequency offset violation using a counter-based digital frequency lock detector comprising a reference counter clocked by a reference clock and a target counter clocked by a target clock, wherein said target counter is n bits and n is less than a number of bits of said reference counter, and wherein said method comprises the step of:

detecting said frequency offset violation by comparing a count value of said target counter to a count value of an n bit counter, wherein said frequency offset violation occurs when said target clock has a frequency offset relative to said reference clock that is greater than or equal to a non-zero predefined threshold value, wherein said count value of said target counter indicates a number of clock cycles of said target clock since a reset of said target counter and wherein said count value of said n bit counter indicates a number of clock cycles of said reference clock since a reset of said n bit counter.

7. The method of claim 6, wherein said frequency offset violation is detected by comparing said target counter to a second n bit reference counter clocked by said reference clock.

8. The method of claim 6, wherein said frequency offset violation is detected by comparing said target counter to n least significant bits of said reference counter.

9. The method of claim 6, wherein said frequency offset violation can be detected before said reference counter reaches a maximum value.

10. The method of claim 6, wherein said frequency offset violation includes one or more transient out-of-range offset errors.

11. An integrated circuit comprising:

a counter-based digital frequency lock detector, comprising:

a reference counter clocked by a reference clock; and a target counter clocked by a target clock, wherein said target counter is n bits and n is less than a number of bits of said reference counter and wherein a frequency offset violation of said target clock is detected by comparing a count value of said target counter to a count value of an n bit counter, wherein said frequency offset violation occurs when said target clock has a frequency offset relative to said reference clock that is greater than or equal to a non-zero predefined threshold value, wherein said count value of said target counter indicates a number of clock cycles of said target clock since a reset of said target counter and wherein said count value of said n bit counter indicates a number of clock cycles of said reference clock since a reset of said n bit counter.

12. The integrated circuit of claim 11, wherein said frequency offset violation is detected by comparing said target counter to a second n bit reference counter clocked by said reference clock.

13. The integrated circuit of claim 11, wherein said frequency offset violation is detected by comparing said target counter to n least significant bits of said reference counter.

14. The integrated circuit of claim 11, wherein said frequency offset violation can be detected before said reference counter reaches a maximum value.

15. The integrated circuit of claim 11, wherein said frequency offset violation includes one or more transient out-of-range offset errors.

16. A counter-based digital frequency lock detector, comprising:

a reference counter clocked by a reference clock; and a target counter clocked by a target clock, wherein said target counter is n bits and n is less than a number of bits of said reference counter and wherein said target counter and a second n bit reference counter clocked by said reference clock are initialized to different values, and wherein a frequency offset violation of said target clock is detected by comparing count values of said target counter and said second reference counter, wherein said frequency offset violation occurs when said target clock has a frequency offset relative to said reference clock is greater than or equal to a non-zero predefined threshold value, wherein said count value of said target counter indicates a number of clock cycles of said target clock since a reset of said target counter and wherein said count value of said n bit counter indicates a number of clock cycles of said reference clock since a reset of said n bit counter.

17. The counter-based digital frequency lock detector of claim 16, wherein said frequency offset violation occurs when said target counter and said second reference counter have a same value.

* * * * *